US009819077B1

(12) United States Patent
Desclos et al.

(10) Patent No.: US 9,819,077 B1
(45) Date of Patent: Nov. 14, 2017

(54) MULTI-FEED ANTENNA OPTIMIZED FOR NON-50 OHM OPERATION

(71) Applicant: Ethertronics, Inc., San Diego, CA (US)

(72) Inventors: Laurent Desclos, San Diego, CA (US); Jeffrey Shamblin, San Marcos, CA (US)

(73) Assignee: ETHERTRONICS, INC., San Diego, CA (US)

( * ) Notice: Subject to any disclaimer, the term of this patent is extended or adjusted under 35 U.S.C. 154(b) by 0 days.

(21) Appl. No.: 14/662,216

(22) Filed: Mar. 18, 2015

Related U.S. Application Data

(60) Provisional application No. 61/955,059, filed on Mar. 18, 2014.

(51) Int. Cl.

| | |
|---|---|
| ***H01Q 1/44*** | (2006.01) |
| ***H01Q 1/50*** | (2006.01) |
| ***H03H 7/38*** | (2006.01) |
| ***H01Q 9/04*** | (2006.01) |
| ***H01Q 5/328*** | (2015.01) |
| ***H01Q 5/40*** | (2015.01) |
| ***H01Q 5/35*** | (2015.01) |

(52) U.S. Cl.
CPC ............... *H01Q 1/50* (2013.01); *H01Q 5/328* (2015.01); *H01Q 5/35* (2015.01); *H01Q 5/40* (2015.01); *H01Q 9/0421* (2013.01); *H03H 7/38* (2013.01)

(58) Field of Classification Search
CPC .......... H01Q 1/50; H01Q 1/1007; H01Q 1/44; H01Q 5/0037; H01Q 5/0048; H01Q 5/0072; H01Q 9/0421; H01Q 5/328; H01Q 5/35; H01Q 5/40; H04M 1/00; H04M 1/0202
See application file for complete search history.

(56) References Cited

U.S. PATENT DOCUMENTS 7,043,285 B2 * 5/2006 Boyle ........................ H03H 7/46 455/575.7
7,469,131 B2 * 12/2008 Nail ..................... H04B 1/0057 333/126
8,890,754 B2 * 11/2014 Lin ......................... H01Q 5/335 343/700 MS
8,942,761 B2 * 1/2015 Vance .................... H01Q 1/243 343/857
9,030,370 B2 * 5/2015 Petrovic ................. H01Q 1/007 343/850
9,172,422 B2 * 10/2015 Desclos ................... H04B 1/44

* cited by examiner

*Primary Examiner* — Hoang Nguyen
(74) *Attorney, Agent, or Firm* — Coastal Patent Law Group, P.C.

(57) ABSTRACT

A multi-feed antenna is described where the antenna is optimized for the natural impedance state per frequency band. Multiple feed points are accessed as a function of frequency and use case to provide a feed port that is operating at the natural impedance state for the antenna structure. Impedance transforming circuits can be applied to the feed point to form impedance matching circuits to transform the antenna impedance to a characteristic impedance of the system or circuit interfacing with the antenna. The impedance transforming circuits can be eliminated and the RF circuitry interfacing with the antenna can be configured to operate at the natural frequency of the antenna.

10 Claims, 10 Drawing Sheets

For this circuit configuration, $Z_{antenna} = Z_1 = Z_2$
$Z_{PA}$ = impedance of power amplifier, typically low compared to 50 Ohm system
The receiver is typically operates well in a 50 Ohm system For this circuit configuration, $Z_{antenna} = Z_1 = Z_2$
$Z_{PA}$ = impedance of power amplifier, typically low compared to 50 Ohm system
The receiver is typically operates well in a 50 Ohm system

MULTI-FEED ANTENNA OPTIMIZED FOR NON-50 OHM OPERATION

CROSS-REFERENCE TO RELATED APPLICATIONS

This application claims benefit of priority with U.S. Provisional Ser. No. 61/955,059, filed Mar. 18, 2014, titled " "; the contents of which are hereby incorporated by reference.

FIELD OF INVENTION

The present invention relates generally to the field of wireless communication. In particular, the present invention relates to antennas for multi-frequency band operation and the optimization of these antennas for improved impedance matched states and optimal power transfer.

BACKGROUND OF THE INVENTION

Prior to standardization to the 50 Ohm characteristic impedance for RF and microwave components and test equipment, characteristic impedances of components and systems were chosen based on the application. For instance, for high power applications 30 to 40 Ohms was chosen for coaxial transmission lines to accommodate maximum power handling. If an application required minimal losses from the transmission lines, then a 93 Ohm transmission line utilizing an air dielectric proved to work well. For early telecommunication systems 77 Ohm characteristic impedance was chosen for Teflon filled coaxial cables to provide for lowest loss operation. Depending on the application a characteristic impedance was chosen for the transmission lines and the components connecting to the transmission lines were designed to have an equivalent impedance, or a matching circuit was designed and implemented to transform a component from its own natural impedance to the characteristic impedance of the transmission line.

The proliferation of communication and radar systems developed and used during World War II pointed toward the need for a standard characteristic impedance that could be used for these communication systems to allow for a broad group of companies to develop components such as filters, switches, antennas, amplifiers, etc. to be connected to form a complete communication or RF circuit. 50 Ohms was chosen as this standard for RF and communication systems developed in America during this time, and has since been adopted across most of the World for a wide number of industries. This 50 Ohm standard impedance has been adopted by the RF communication systems being integrated into mobile communications such as cell phones, wireless enabled Tablets and laptops, and M2M (Machine to Machine) applications.

With a 50 Ohm characteristic impedance standard in place, component manufacturers can design and manufacture component to be used in communication systems. The drawback with this approach is that some components such as antennas and power amplifiers tend to have natural device impedances that are substantially different than 50 Ohms. This forces the component designer to impedance match the component such that it presents an impedance close to 50 Ohms. Impedance matching a component can take the form of a lumped component matching circuit comprised of inductors and/or capacitors, or it can be comprised of distributed reactance formed by using sections of transmission line in series or parallel configurations. These sections of transmission lines are often termed "tuning stubs". The matching circuit will have losses associated with it as well as cost, resulting in reduced efficiency in terms of power transfer through the device along with increased cost and size requirements. The losses incurred in the matching circuit of an antenna will result in reduced efficiency of the radiated signal.

A metric as important as matching circuit losses in antenna design is bandwidth. With the additional frequency band requirements of LTE (Long Term Evolution) in cellular communication systems, current mobile wireless devices are requiring wider frequency bandwidth coverage. When an antenna is designed for a communication system such as a cell phone, the antenna is designed to cover the frequency bands of interest, and the antenna must be designed to present a 50 Ohm impedance to the RF circuitry such as an RFFE (Radio Frequency Front-End) that the antenna is connected to. The 50 Ohm requirement tends to decrease the total bandwidth due to the varying impedance properties of an antenna across wide frequency ranges. Designing a matching circuit to transform impedances of the antenna at low frequencies as well as high frequencies results in an increase in matching circuit losses and a reduction in available bandwidth. The instantaneous bandwidth available from the antenna would increase if the antenna could be operated at its natural impedance. By operating at its natural impedance, matching circuits at the antenna RFFE interface would not be required. More specifically, if the antenna can operate at several different natural impedances, with the natural impedance of each frequency band used during operation, then bandwidth can be optimized and matching circuit losses can be minimized.

For mobile communication devices used in cellular communications, the continued adoption of 4G LTE is causing a continued increase in the number of frequency bands needed to be serviced by the RF radio. Also, the introduction of carrier aggregation, where two or more frequency channels, either within the same frequency band or in different frequency bands, are used for simultaneous communication is requiring different topologies for the RFFE. To simplify integration of a wide number of frequency bands and to improve carrier aggregation performance, RFFE architectures are being proposed and implemented wherein a single wide band antenna with a single feed port is being replaced with multiple antennas or a multi-feed antenna. Using multiple antennas where one antenna is used to service the low band frequencies such as 3G and 4G frequencies in the 698 to 960 MHz. range, a second antenna is used to service mid-band frequencies in the range of 1710 to 2170 MHz., and a third antenna is used to service high band frequencies in the range of 2300 to 2700 MHz. allows for each antenna to be better optimized for the frequency bands of interest. Part of this optimization can be associated with the matching circuit to impedance match the antenna to a 50 Ohm characteristic impedance. By restricting the frequency range of the antenna a matching circuit can typically be developed using less components and/or incurring less insertion loss compared to a multi-band antenna. However, if the antenna could be operated at its natural frequency the matching circuit would not be required, reducing insertion loss, cost, and space required for the matching circuit.

SUMMARY OF THE INVENTION

A multi-feed antenna is described where the antenna is optimized for the natural impedance state per frequency band. Multiple feed points are accessed as a function of frequency and use case to provide a feed port that is operating at the natural impedance state for the antenna structure. Impedance transforming circuits can be applied to the feed point to form impedance matching circuits to transform the antenna impedance to a characteristic impedance of the system or circuit interfacing with the antenna. The impedance transforming circuits can be eliminated and the RF circuitry interfacing with the antenna can be configured to operate at the natural frequency of the antenna.

DETAILED DESCRIPTION OF EMBODIMENTS

Figure 1:
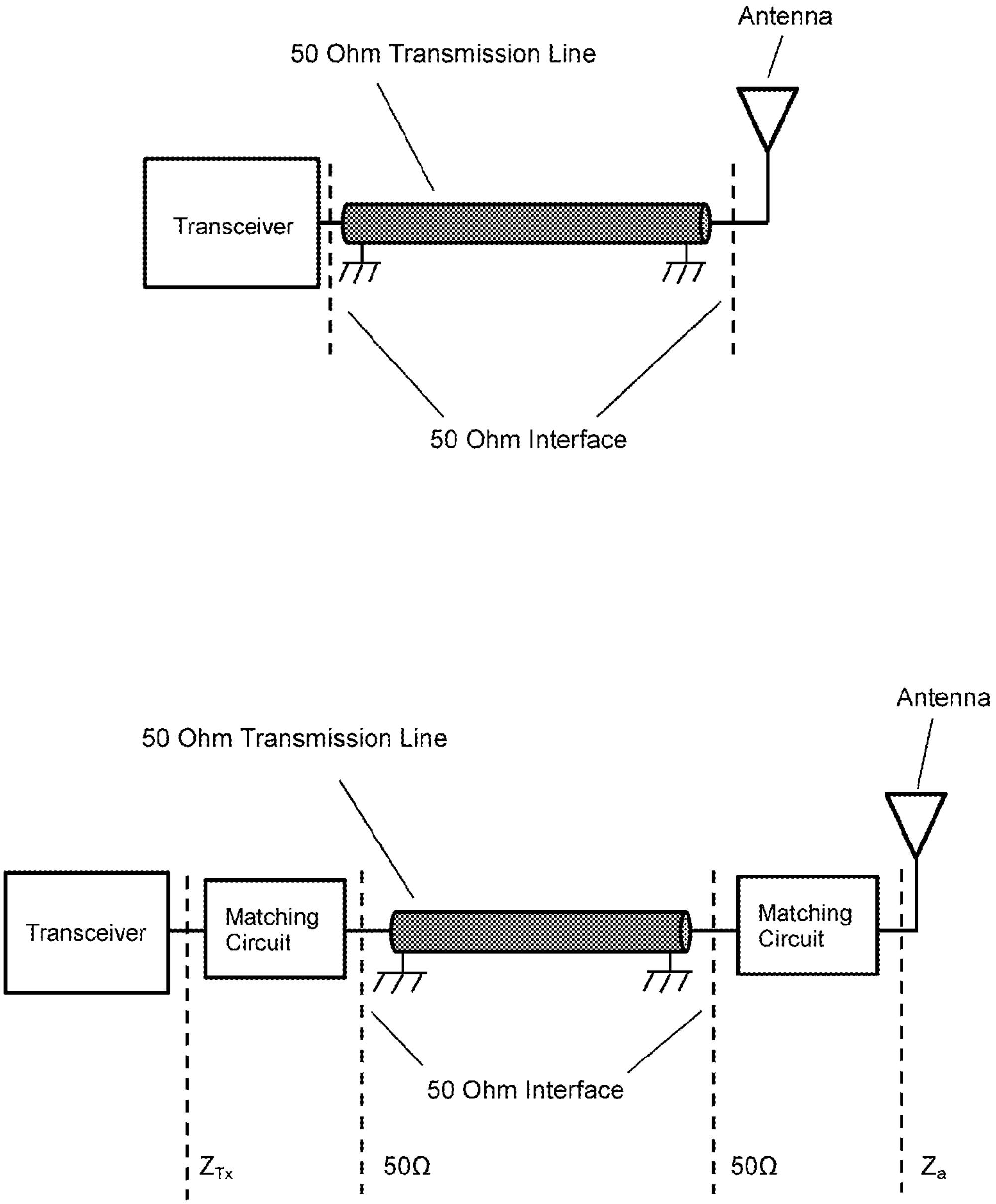
FIG. 1 illustrates an antenna connected to a transceiver using a 50 Ohm coaxial cable.

This patent describes a method of designing multi-port antennas and connecting these antenna ports to transceivers or other components in an RF system, where the antenna ports are matched to the natural impedance of the antenna at the frequency range that the antenna port is optimized to. Benefits in terms of reduced cost, reduced circuit losses, and a reduction in area required to integrate matching circuits can be had by reducing or eliminating the need to transform impedances as antennas, transmission lines, and circuit components are configured into transceiver systems.

One embodiment of this invention is an antenna containing three feed ports, with port 1 configured for use at low frequency bands, port 2 configured for use at mid-frequency bands, and port 3 configured for use at high frequency bands. The antenna impedance at the three feed ports is the natural frequency of the antenna. A transmission line is attached to each feed port, with the characteristic impedance of each transmission line chosen to equal the impedance of the antenna feed port connected to. The second port of each transmission line is connected to a matching circuit to impedance match the combination of antenna and transmission line to a transceiver circuit. Implementing this configuration allows for the elimination of any matching components at the antenna port, which results in reduced circuit losses, reduced cost, and reduced circuit board area required for antenna and matching circuit. This three feed port configuration also provides the flexibility of choosing different characteristic impedances for the transceiver and matching circuit junction, which can result in the ability to optimize the impedance transformer at the three frequency bands serviced by the antenna.

Another embodiment of the invention is an antenna with multiple feed ports, with each feed port configured for one or multiple frequency bands. The antenna impedance at the various feed ports is the natural frequency of the antenna at the frequency band or bands serviced by the feed port. A transmission line is attached to each feed port, with the characteristic impedance of each transmission line chosen to equal the impedance of the antenna feed port connected to. The second port of each transmission line is connected to a transceiver circuit. The transceiver circuits are designed to have the characteristic impedance of the transmission line that each transceiver is connected to, with this circuit configuration allowing for the elimination of all matching circuits. This configuration allows for reduced circuit losses, reduced cost, and reduced circuit board area required for antenna and matching circuits. This multi-feed port configuration also provides the flexibility of choosing different characteristic impedances for the transceiver, which can result in the ability to optimize the impedance transformer at the three frequency bands serviced by the antenna.

In another embodiment of the invention an antenna with multiple feed ports is configured such that each feed port operates at either transmit or receive frequencies. The antenna impedance at the various feed ports is the natural frequency of the antenna at the frequency band or bands serviced by the feed port. A transmission line is attached to each feed port, with the characteristic impedance of each transmission line chosen to equal the impedance of the antenna feed port connected to. The second port of each transmission line is connected to either a transmit circuit or a receive circuit. The feed ports and transmission lines configured for use with transmit circuits can be design such that a low characteristic impedance is provided at the transmit circuit/transmission line junction. The transmit circuit containing a power amplifier can be designed to have a low characteristic impedance which is typically an inherent trait of power amplifiers. The feed ports and transmission lines configured for use with receive circuits can be design such that a characteristic impedance is provided at the receive circuit/transmission line junction that is optimal for receive circuit designs.

In yet another embodiment of this invention, a tunable matching circuit is positioned at one or multiple feed ports of an antenna that contains multiple feed ports. The tunable matching circuit is configured with a tunable capacitor, switch, PIN diode or other component capable of varying impedance. A transmission line is attached to each feed port, with the characteristic impedance of each transmission line chosen to equal the impedance of the antenna feed port connected to. The tunable matching circuit provides the capability of dynamically altering the impedance of the antenna which can translate into a wider frequency range that the antenna can cover. The second port of each transmission line is connected to a transceiver circuit. The transceiver circuits are designed to have the characteristic impedance of the transmission line that each transceiver is connected to. This configuration provides a method of optimizing the impedance match between the transceiver and the transmission line/antenna. This multi-feed port configuration also provides the flexibility of choosing different characteristic impedances for the transceiver, which can result in the ability to optimize the impedance transformer at the three frequency bands serviced by the antenna.

In yet another embodiment of this invention, an active antenna is configured such that the electrical length or frequency response of the antenna can be dynamically adjusted. The active antenna is formed by coupling a tunable capacitor, switch, PIN diode or other component capable of varying impedance to the radiating element. This active antenna is configured with multiple feed ports and a transmission line is attached to each feed port, with the characteristic impedance of each transmission line chosen to equal the impedance of the antenna feed port connected to. The second port of each transmission line is connected to a transceiver circuit. The transceiver circuits are designed to have the characteristic impedance of the transmission line that each transceiver is connected to. This configuration provides a method of dynamically altering the frequency response of the antenna to allow for the antenna to cover a wider frequency range. This multi-feed port configuration also provides the flexibility of choosing different characteristic impedances for the transceiver, which can result in the ability to optimize the impedance transformer at the three frequency bands serviced by the antenna.

FIG. 1 illustrates an antenna connected to a transceiver using a 50 Ohm coaxial cable. The antenna is matched to a characteristic impedance of 50 Ohms, and the transceiver is matched to a characteristic impedance of 50 Ohms. Also shown is an antenna with characteristic impedance of Za connected to a matching circuit which matches the antenna to a 50 Ohm system. A coaxial cable connects the antenna to a matching circuit which matches a transceiver to the 50 Ohm system.

Figure 2:
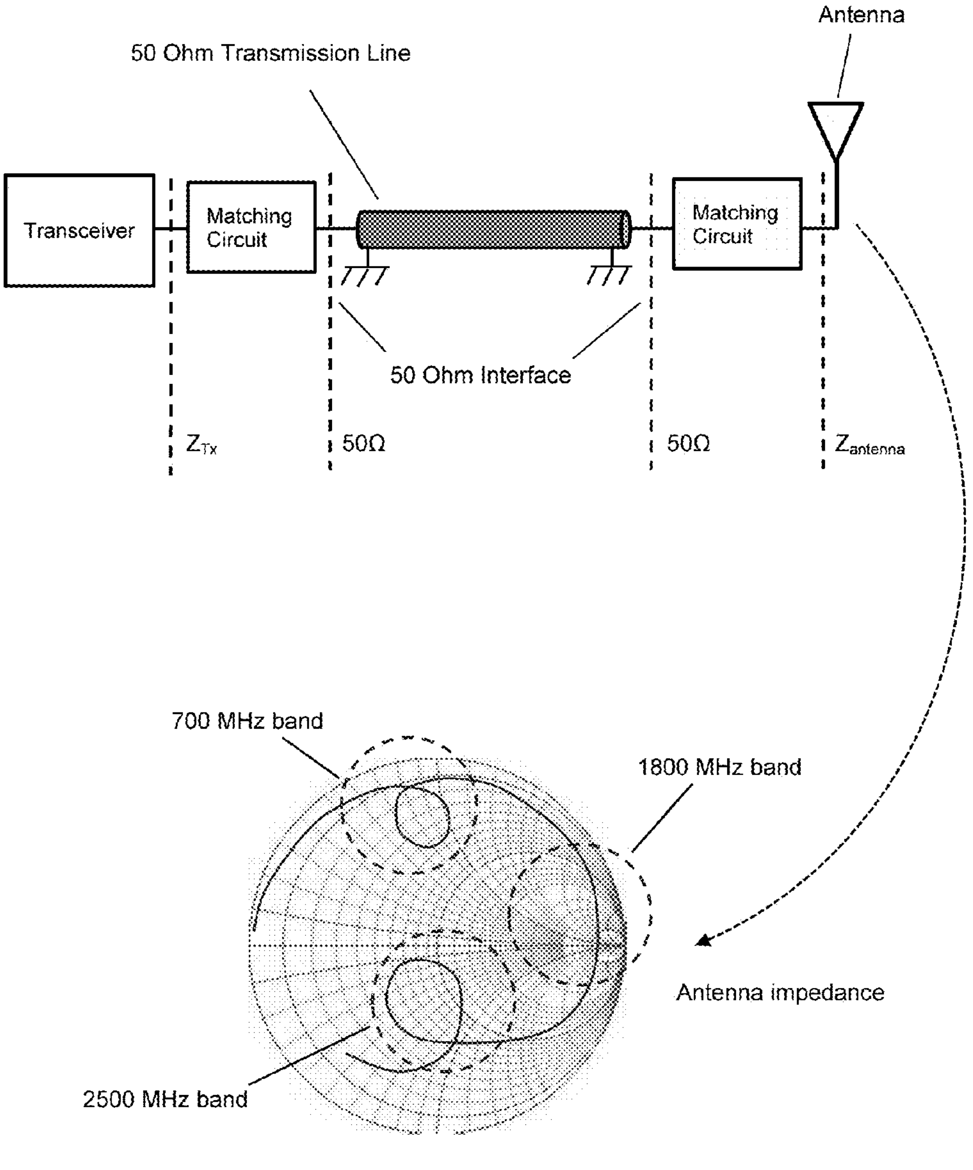
FIG. 2 illustrates an antenna connected to matching circuit which matches the antenna to a 50 Ohm system.

FIG. 2 illustrates an antenna connected to matching circuit which matches the antenna to a 50 Ohm system. A coaxial cable connects the antenna to a matching circuit which matches a transceiver to the 50 Ohm system. The Smith Chart representation of the antenna impedance, Za, is shown and the three frequency regions of interest, 700 MHz, 1800 MHz and 2500 MHz is shown. The three frequencies have different impedance values.

Figure 3:
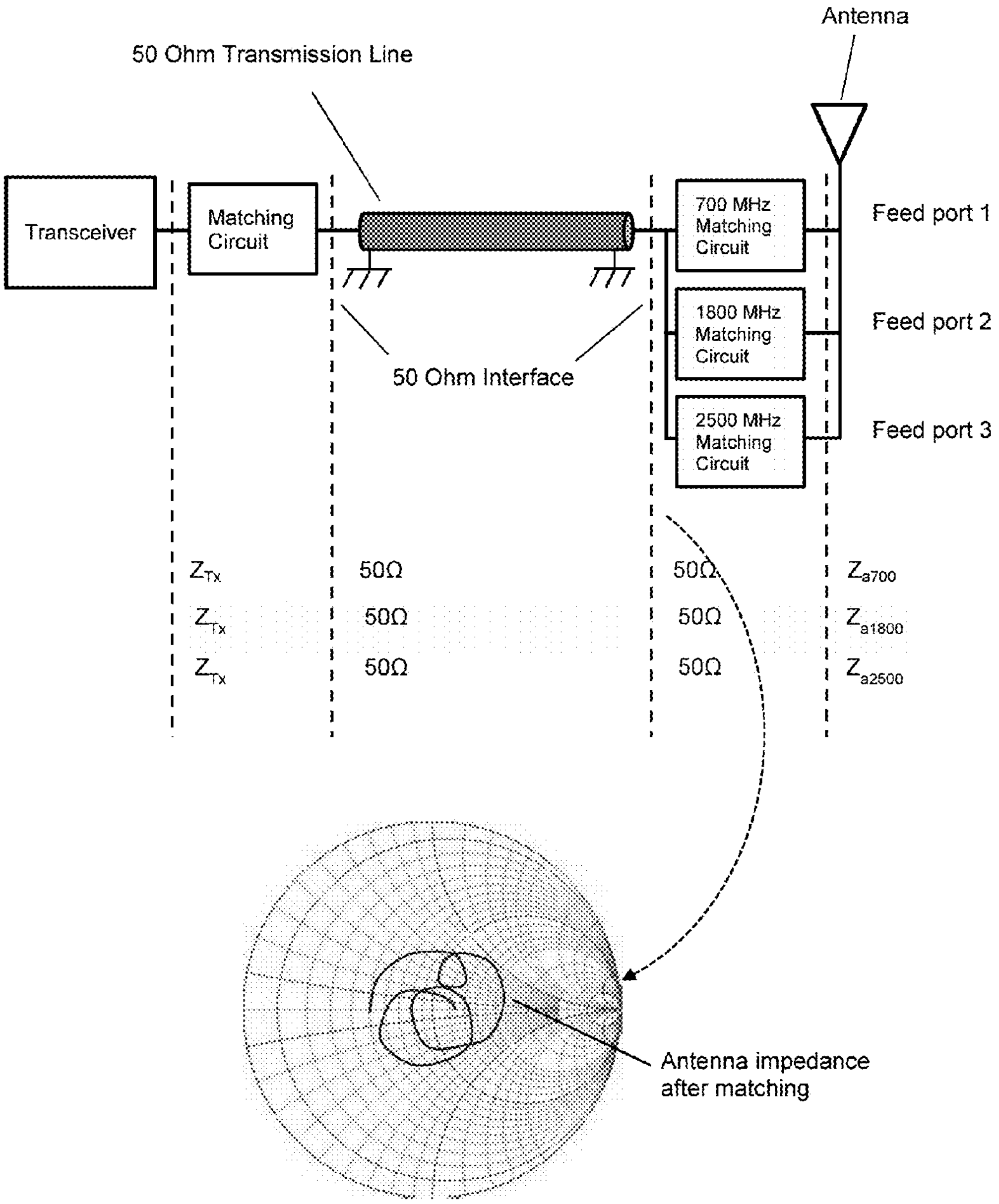
FIG. 3 illustrates an antenna connected to three matching circuits which match the antenna to a 50 Ohm system.

FIG. 3 illustrates an antenna connected to three matching circuits which match the antenna to a 50 Ohm system. The first matching circuit transforms the antenna impedance Za at 700 MHz to 50 Ohms, the second matching circuit transforms the antenna impedance Za at 1800 MHz to 50 Ohms, and the third matching circuit transforms the antenna impedance Za at 2500 MHz to 50 Ohms. A coaxial cable connects the antenna matching circuits to a matching circuit which matches a transceiver to the 50 Ohm system. The Smith Chart representation of the antenna impedance, Za, is shown and the three frequency regions of interest, 700 MHz, 1800 MHz and 2500 MHz is shown. The three frequencies have been matched to a 50 Ohm system.

Figure 4:
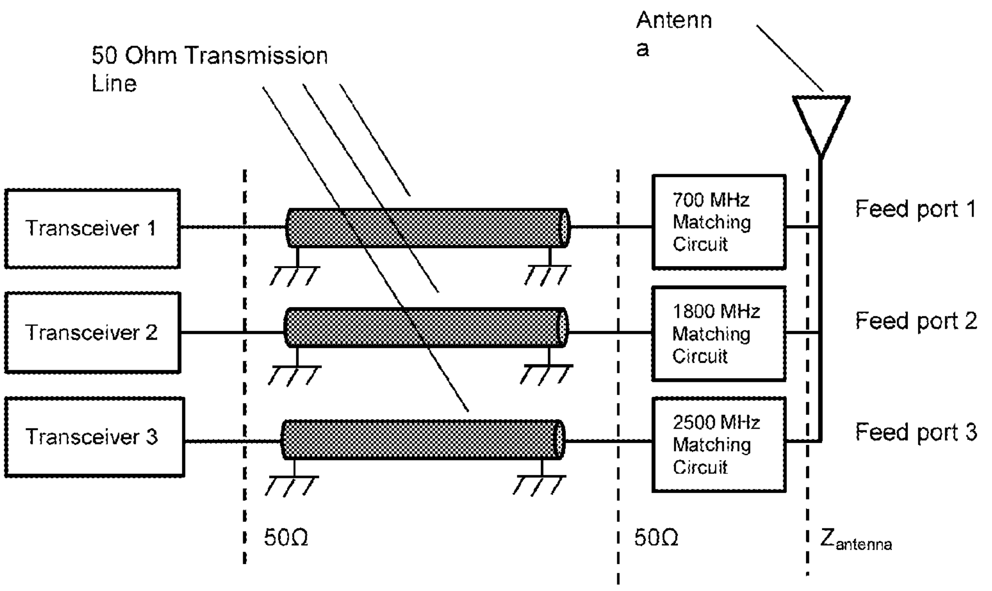
FIG. 4 illustrates an antenna connected to three matching circuits which match the antenna to a 50 Ohm system.

FIG. 4 illustrates an antenna connected to three matching circuits which match the antenna to a 50 Ohm system. The first matching circuit transforms the antenna impedance Za at 700 MHz to 50 Ohms, the second matching circuit transforms the antenna impedance Za at 1800 MHz to 50 Ohms, and the third matching circuit transforms the antenna impedance Za at 2500 MHz to 50 Ohms. Each matching circuit is connected to a coaxial cable. The three coaxial cables are in turn connected to a transceiver.

Figure 5:
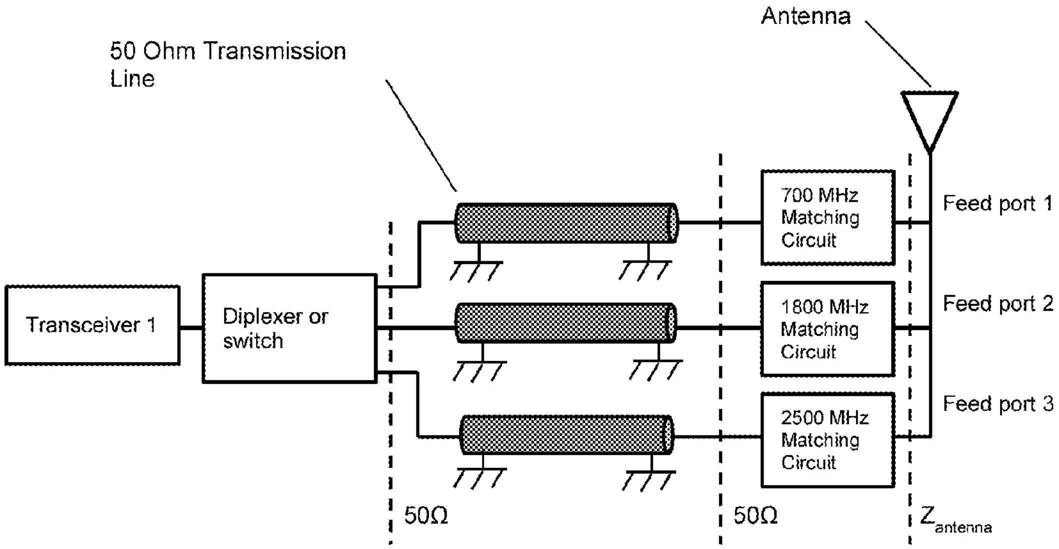
FIG. 5 illustrates an antenna connected to three matching circuits which match the antenna to a 50 Ohm system.

FIG. 5 illustrates an antenna connected to three matching circuits which match the antenna to a 50 Ohm system. The first matching circuit transforms the antenna impedance Za at 700 MHz to 50 Ohms, the second matching circuit transforms the antenna impedance Za at 1800 MHz to 50 Ohms, and the third matching circuit transforms the antenna impedance Za at 2500 MHz to 50 Ohms. Each matching circuit is connected to a coaxial cable. The three coaxial cables are connected to a diplexer or switch, allowing the three coaxial cables to interface to a single transceiver.

Figure 6:
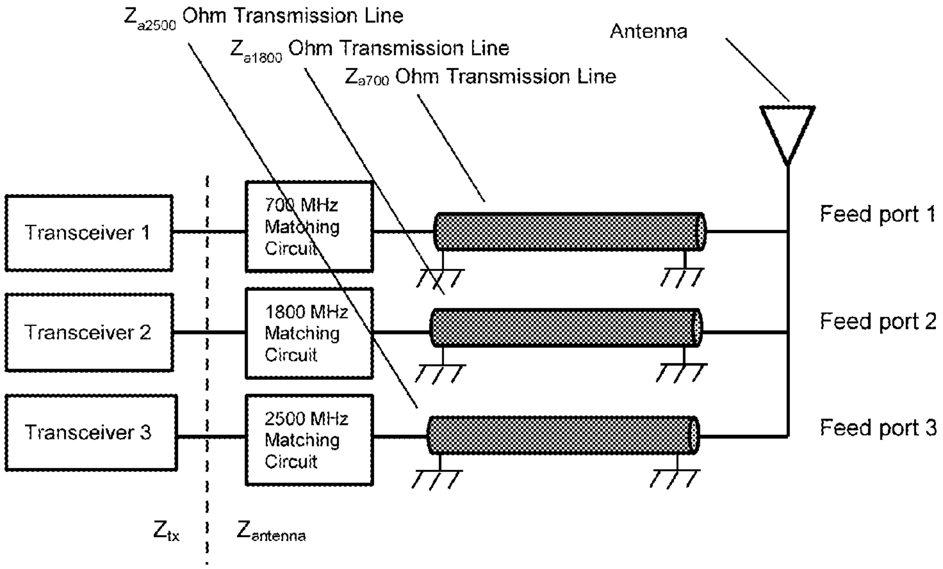
FIG. 6 illustrates a three feed port antenna, with three coaxial cables connected to the antenna, one coaxial cable per feed port.
Figure 6:
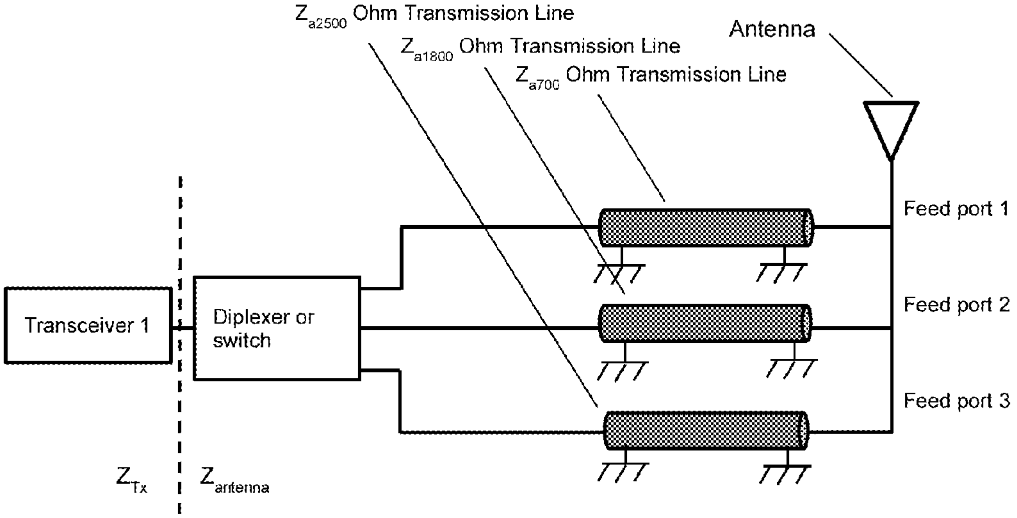

FIG. 6 illustrates a three feed port antenna, with three coaxial cables connected to the antenna, one coaxial cable per feed port. The three coaxial cables have different characteristic impedances, with the characteristic impedance of each cable matching the characteristic impedance of the antenna at a frequency band used by the port of the antenna. At the second port of each coaxial cable is a matching circuit which transforms the impedance of the coaxial cable to the characteristic impedance of the transceiver that the coaxial cable is connected to. Also shown is a three feed port antenna, with three coaxial cables connected to the antenna, one coaxial cable per feed port. The three coaxial cables have different characteristic impedances, with the characteristic impedance of each cable matching the characteristic impedance of the antenna at a frequency band used by the port of the antenna. The second port of each coaxial cable is connected to a diplexer or switch which in turn is connected to a single transceiver.

Figure 7:
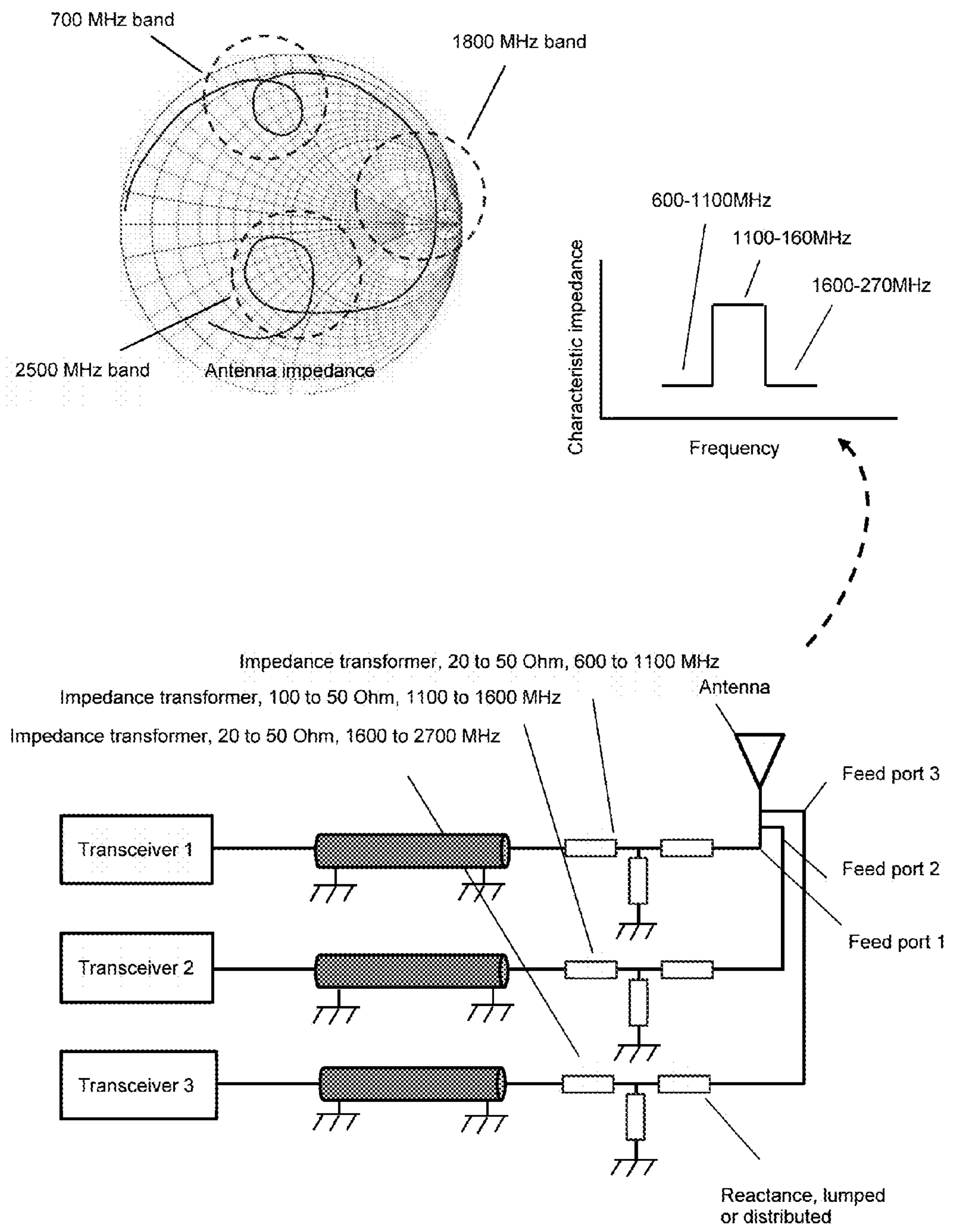
FIG. 7 illustrates a three feed port antenna, with an impedance transformer connected to each feed port.

FIG. 7 illustrates a three feed port antenna, with an impedance transformer connected to each feed port. Feed port 1 operates from 600 to 1100 MHz and the impedance transformer transforms the antenna impedance from 20 to 50 Ohms. Feed port 2 operates from 1100 to 1600 MHz and the impedance transformer transforms the antenna impedance from 100 to 50 Ohms. Feed port 3 operates from 1600 to 2700 MHz and the impedance transformer transforms the antenna impedance from 20 to 50 Ohms. The three transformers are connected to three coaxial cables, which in turn are connected to transceivers.

Figure 8:
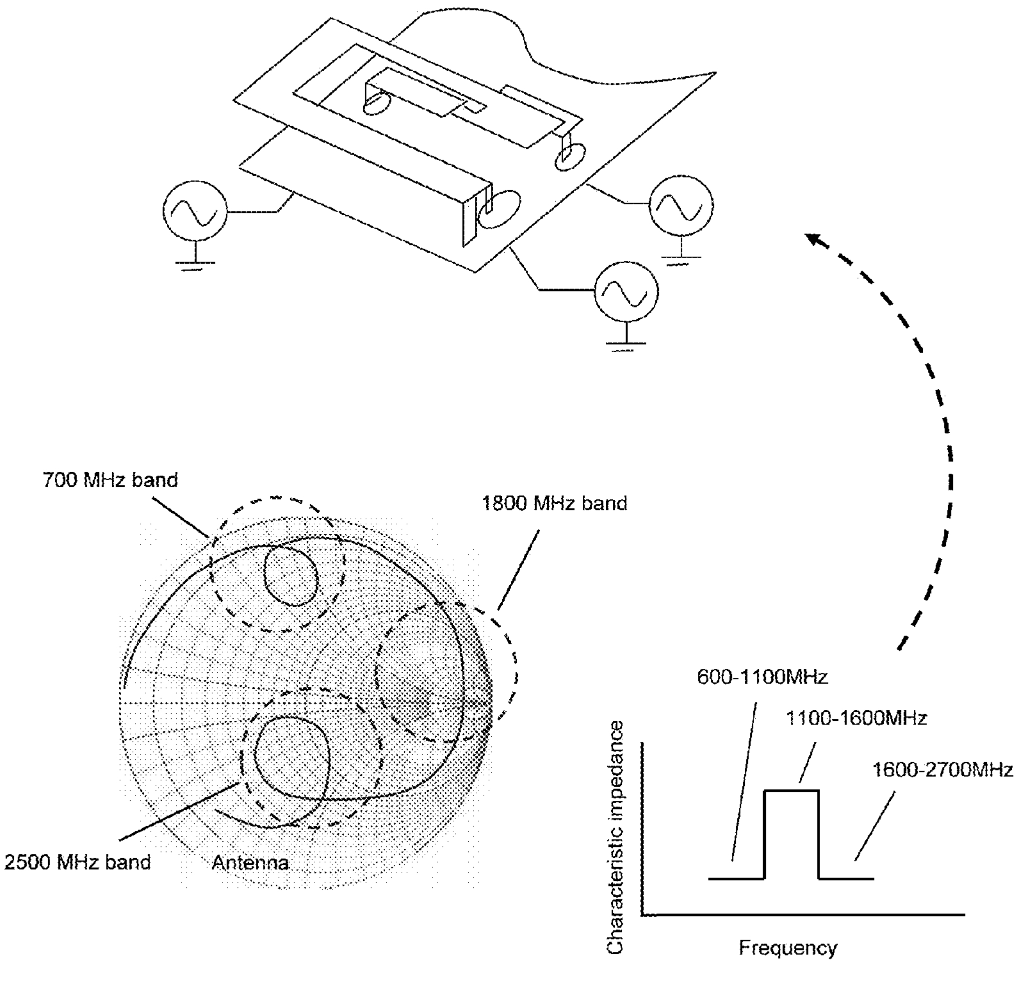
FIG. 8 illustrates a three port antenna, with one port tuned to operate at 700 MHz, a second port tuned to operate at 1800 MHz, and a third port tuned to operate at 2500 MHz.

FIG. 8 illustrates a three port antenna, with one port tuned to operate at 700 MHz, a second port tuned to operate at 1800 MHz, and a third port tuned to operate at 2500 MHz. The first and third antenna ports have a characteristic impedance of 20 Ohms, while the second antenna port has a characteristic impedance of 100 Ohms.

Figure 9:
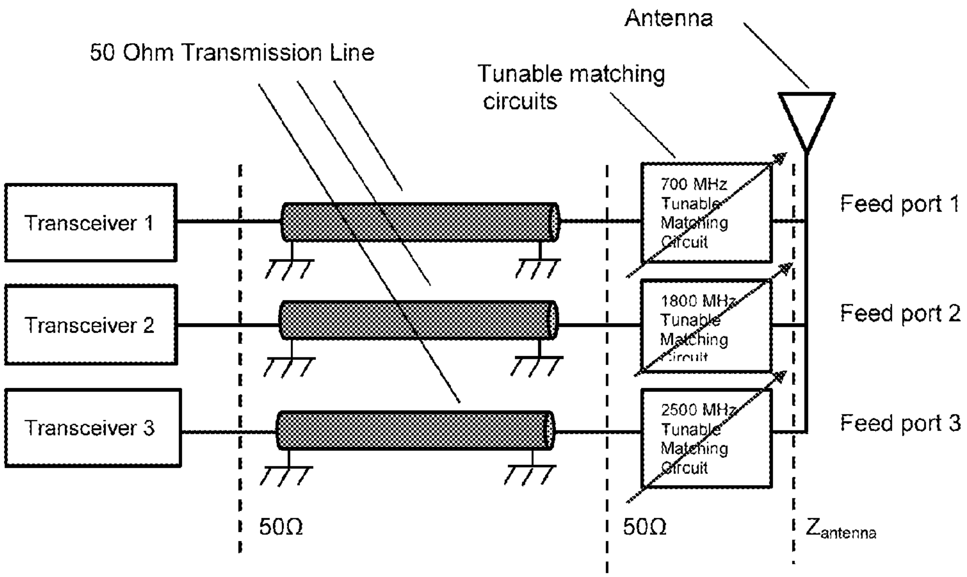
FIG. 9 illustrates an antenna connected to three tunable matching circuits which match the antenna to a 50 Ohm system.

FIG. 9 illustrates an antenna connected to three tunable matching circuits which match the antenna to a 50 Ohm system. The first tunable matching circuit transforms the antenna impedance Za at 700 MHz to 50 Ohms, the second tunable matching circuit transforms the antenna impedance Za at 1800 MHz to 50 Ohms, and the third tunable matching circuit transforms the antenna impedance Za at 2500 MHz to 50 Ohms. Each tunable matching circuit is connected to a coaxial cable. The three coaxial cables are in turn connected to a transceiver.

Figure 10:
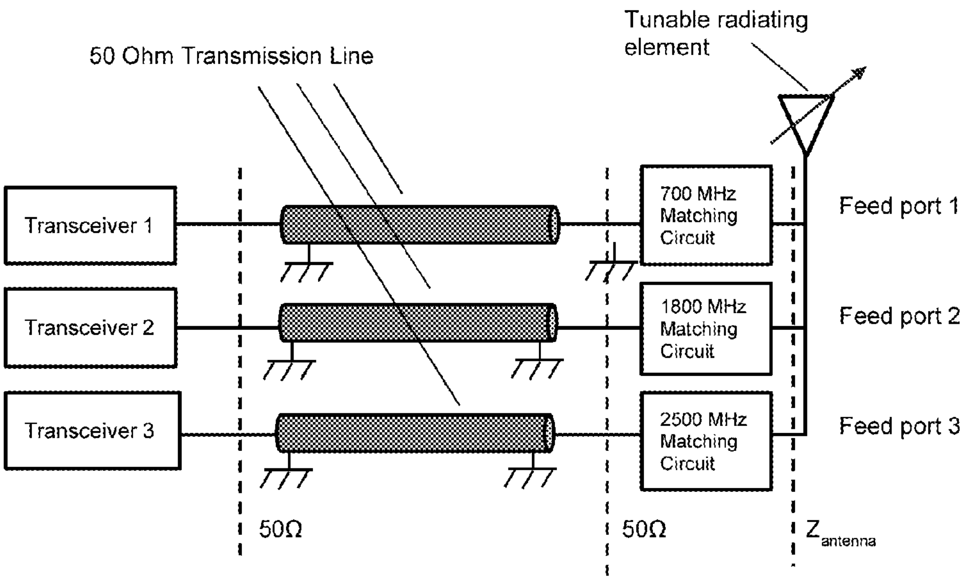
FIG. 10 illustrates an active antenna element connected to three matching circuits which match the antenna to a 50 Ohm system.

FIG. 10 illustrates an active antenna element connected to three matching circuits which match the antenna to a 50 Ohm system. The active antenna element has one or multiple active components such as switches or tunable capacitors coupled to the radiating element, with these active components independent of the matching circuits at the feed points of the antenna. The first matching circuit transforms the antenna impedance Za at 700 MHz to 50 Ohms, the second matching circuit transforms the antenna impedance Za at 1800 MHz to 50 Ohms, and the third matching circuit transforms the antenna impedance Za at 2500 MHz to 50 Ohms. Each matching circuit is connected to a coaxial cable. The three coaxial cables are in turn connected to a transceiver.

Figure 11:
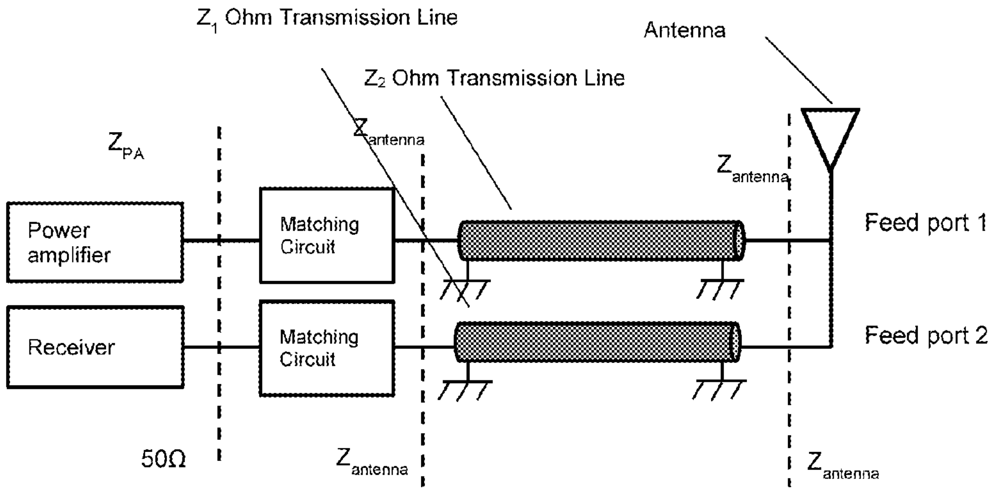
FIG. 11 illustrates a two feed port antenna, with two coaxial cables connected to the antenna, one coaxial cable per feed port.

FIG. 11 illustrates a two feed port antenna, with two coaxial cables connected to the antenna, one coaxial cable per feed port. The two coaxial cables have different characteristic impedances, with the characteristic impedance of each cable matching the characteristic impedance of the antenna at a frequency band used by the port of the antenna. At the second port of each coaxial cable is a matching circuit which transforms the impedance of the coaxial cable to the characteristic impedance of the circuit that the coaxial cable is connected to. The second port of the first coaxial cable is connected to a power amplifier which is used for transmitting. The second port of the second coaxial cable is connected to a receiver which is used for receiving signals.

Figure 12:
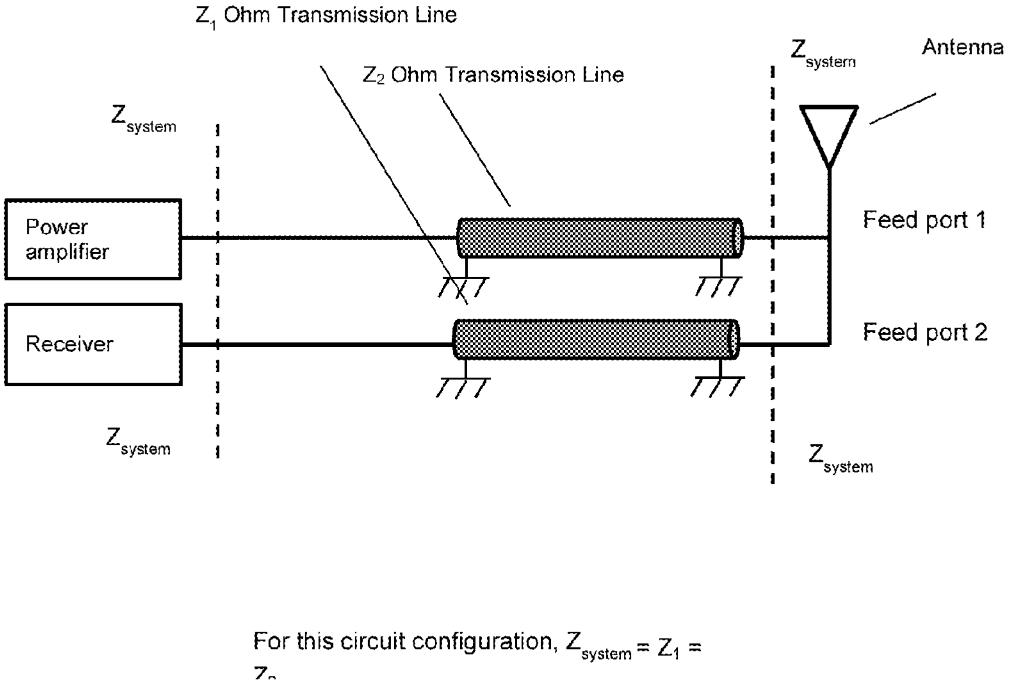
FIG. 12 illustrates a two feed port antenna, with two coaxial cables connected to the antenna, one coaxial cable per feed port.

FIG. 12 illustrates a two feed port antenna, with two coaxial cables connected to the antenna, one coaxial cable per feed port. The two coaxial cables have different characteristic impedances, with the characteristic impedance of each cable matching the characteristic impedance of the antenna at a frequency band used by the port of the antenna. The second port of the first coaxial cable is connected to a power amplifier which is used for transmitting. The second port of the second coaxial cable is connected to a receiver which is used for receiving signals. Matching circuits are not required in this circuit configuration due to the antenna being designed such that the characteristic impedance of the two feed ports of the antenna has the same characteristic impedance as the transmission lines connected to the feed ports, and the transmission line characteristic impedance is the same as the characteristic impedance of the power amplifier and the receiver.

What is claimed is:

1. An antenna system optimized for non-50 ohm operation, the antenna system comprising:

an antenna comprising a first feed port and a second feed port associated therewith, the antenna having a first frequency band associated with the antenna when excited at the first feed port and a second frequency band associated with the antenna when excited at the second feed port, wherein the second frequency band is distinct from the first frequency band, and the antenna further having a first characteristic impedance associated with the antenna at the first frequency band and the first feed port and a second characteristic impedance associated with the antenna at the second frequency band and the second feed port, wherein the second characteristic impedance is distinct from the first characteristic impedance;

a first transmission line having a first end thereof coupled to the first feed port of the antenna, and a second end of the first transmission line being coupled to a first RF circuit, wherein the first transmission line is selected to have an impedance thereof that is equivalent to the first characteristic impedance of the antenna;

a second transmission line having a first end thereof coupled to the second feed port of the antenna, and a second end of the second transmission line being coupled to the first RF circuit or a second RF circuit, wherein the second transmission line is selected to have an impedance thereof that is equivalent to the second characteristic impedance of the antenna.

2. The antenna system of claim 1, wherein a matching circuit is coupled between the first RF circuit and the second end of the first transmission line for impedance matching the combination of the antenna and first transmission line with the matching circuit.

3. The antenna system of claim 2, wherein the matching circuit is coupled to the second end of the first transmission line.

4. The antenna system of claim 1, wherein a first matching circuit is coupled between the first RF circuit and the second end of the first transmission line for impedance matching the combination of the antenna and first transmission line with the first matching circuit.

5. The antenna system of claim 4, wherein a second matching circuit is coupled between the second RF circuit and the second end of the second transmission line for impedance matching the combination of the antenna and second transmission line with the second matching circuit.

6. The antenna system of claim 1, wherein each of the second end of the first transmission line and the second end of the second transmission line are coupled to a diplexer or switch, wherein the diplexer or switch is further coupled to the first RF circuit.

7. The antenna system of claim 1, wherein the first RF circuit comprises a first transceiver.

8. The antenna system of claim 1, wherein the second RF circuit comprises a second transceiver.

9. The antenna system of claim 1, wherein the first RF circuit comprises a power amplifier.

10. The antenna system of claim 1, wherein the second RF circuit comprises a receiver circuit.

* * * * *